United States Patent [19]
Talwar

[11] Patent Number: 6,075,498
[45] Date of Patent: Jun. 13, 2000

[54] SURFACE WAVE DIRECTIONAL DETECTION SYSTEM AND METHOD

[75] Inventor: Ashok K. Talwar, Westlake Village, Calif.

[73] Assignee: American Nucleonics Corp., Westlake Village, Calif.

[21] Appl. No.: 08/001,825

[22] Filed: Jan. 8, 1993

[51] Int. Cl.[7] .............................. H01Q 21/08; G01S 5/04
[52] U.S. Cl. ............................................. 343/844; 342/448
[58] Field of Search ..................................... 343/742, 867, 343/844; 342/432, 448, 153; H01Q 21/08

[56] References Cited

U.S. PATENT DOCUMENTS

| | | | |
|---|---|---|---|
| 1,947,247 | 2/1934 | Bruce | 343/844 |
| 4,063,250 | 12/1977 | Fenwick | 343/844 |
| 4,414,550 | 11/1983 | Tresselt | 343/700 MS |
| 4,611,212 | 9/1986 | Lee | 343/844 |

*Primary Examiner*—Michael C. Wimer
*Attorney, Agent, or Firm*—Hoffmann & Baron, LLP

[57] ABSTRACT

A surface wave directional detection system for determining the direction in which an electromagnetic wave propagating along a metallic surface is travelling includes a first loop probe and a second loop probe positioned in close proximity to the metallic surface so that the electromagnetic wave induces a signal in each of the loop probes. The two loop probes are separated by a quarter wavelength so that the two signals induced in the probes are out of phase. The first and second loop probes are connected by equal length transmission lines to a quadrature hybrid which generates two output signals that vary in magnitude in correspondence with the direction of travel of the electromagnetic surface wave. The two output signals from the quadrature hybrid are provided to RF detectors, which generate output voltage signals that vary in proportion to the magnitude of the output signals from the quadrature hybrid. The outputs of the RF detectors are connected to a comparator, which compares the output voltage signals from the RF detectors and generates an output signal which is indicative of the direction of travel of the electromagnetic surface wave.

15 Claims, 6 Drawing Sheets

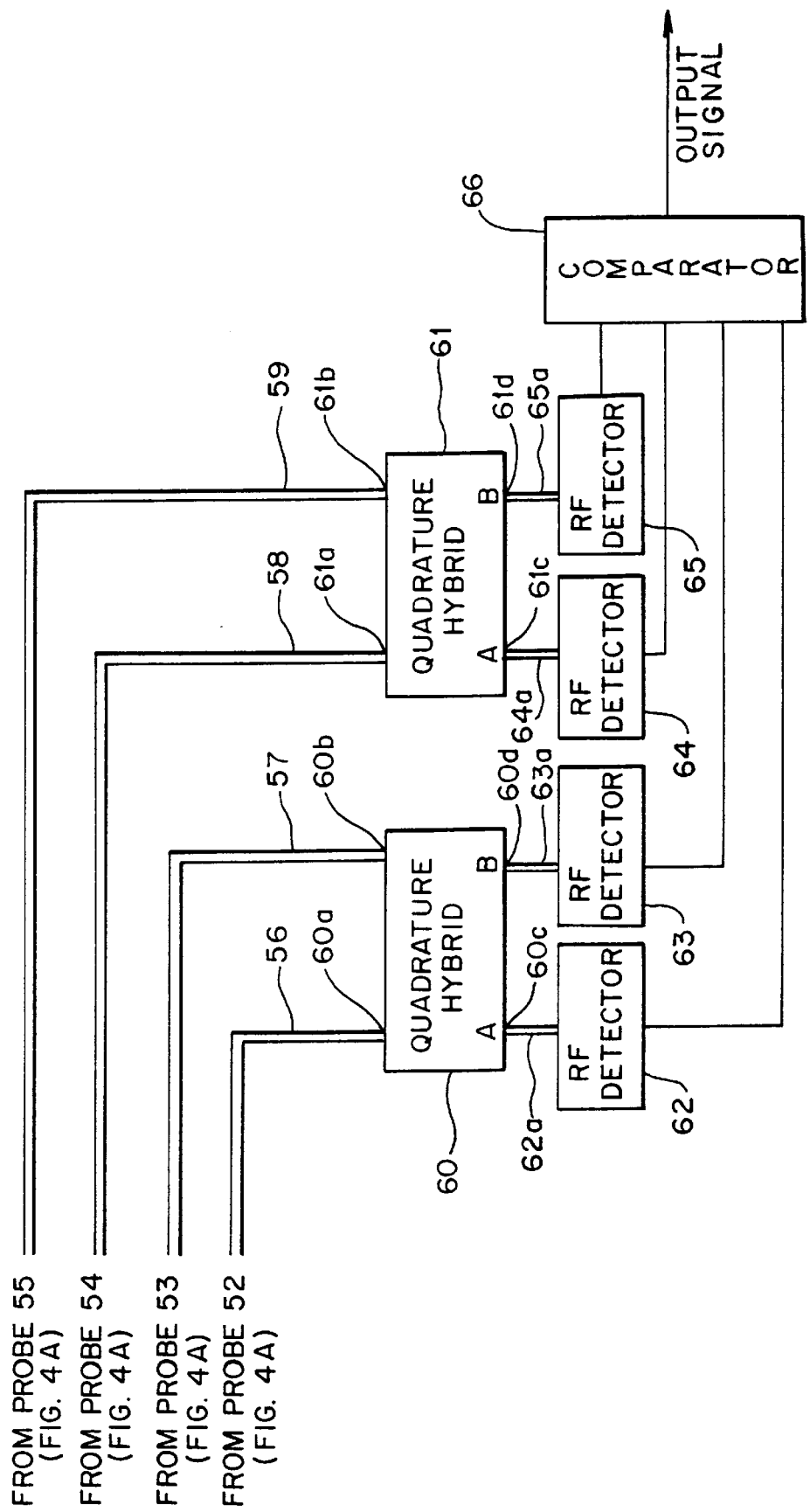

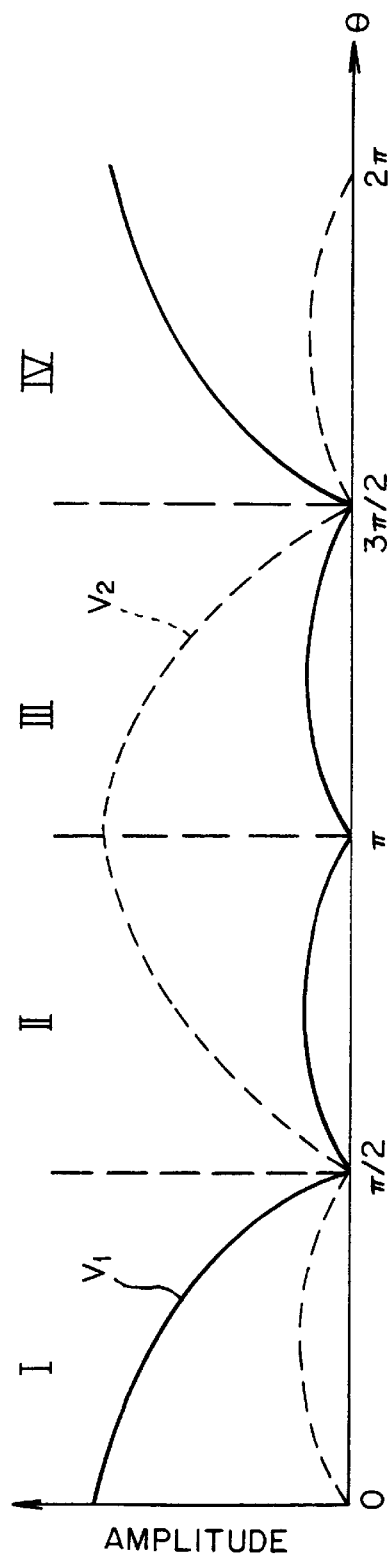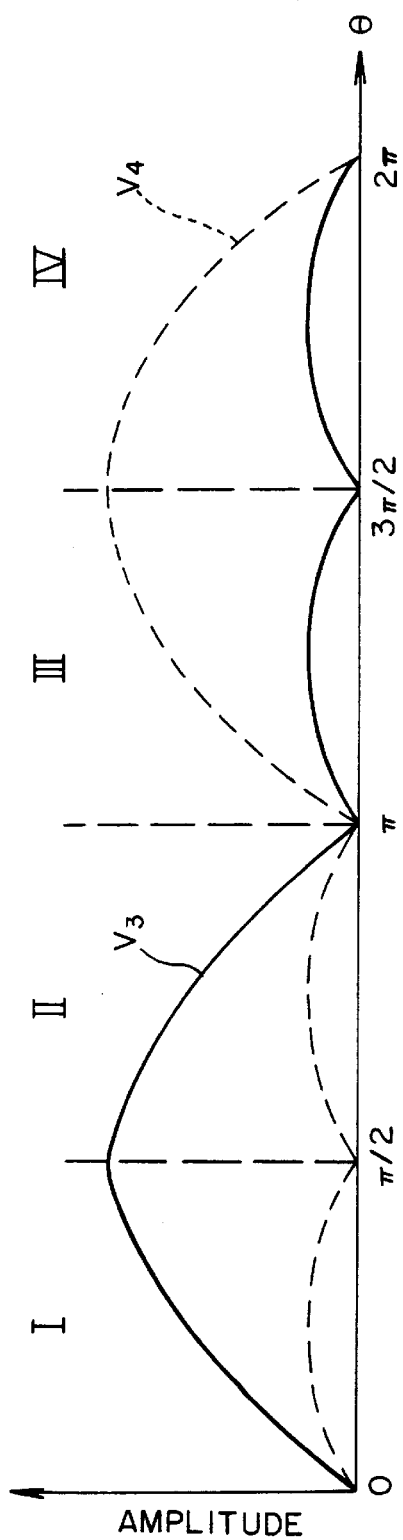

SURFACE WAVE DIRECTIONAL DETECTION SYSTEM AND METHOD

BACKGROUND OF THE INVENTION

1. Field of the Invention

The present invention relates to a surface wave directional detection system and method, and more particularly relates to a surface wave directional detection system and method for determining the direction in one or two dimensions which an electromagnetic wave within a known range of frequencies is propagating along a metal surface.

2. Description of the Related Art

It is well known that electromagnetic waves will propagate along an open metallic surface. If the surface is coated with a dielectric material or if the surface is corrugated, the electromagnetic wave energy is confined to the vicinity of the surface. More particularly, when the metallic surface is coated with a dielectric material or is corrugated, very little of the electromagnetic energy of the wave is radiated away from the surface as the wave propagates thereon. Such electromagnetic waves may be initiated upon a metallic surface by specially designed launchers. They also may be launched by electromagnetic waves emanating from a remote source which arrive incident upon the metallic surface. In some applications, it is required to determine the direction of these electromagnetic surface waves.

OBJECTS AND SUMMARY OF THE INVENTION

It is an object of the present invention to provide a surface wave directional detection system and method for determining the direction in one or two dimensions of an electromagnetic wave within a known range of frequencies propagating along a metallic surface.

It is another object of the present invention to provide a surface wave directional detection system and method which does not require measurements to be made at radio frequencies (RF).

It is a further object of the present invention to provide a surface wave directional detection system and method which can determine the direction of travel of an electromagnetic surface wave, which determination is made independently of the signal strength of the electromagnetic wave.

It is yet another object of the present invention to provide a surface wave directional detection system and method which can determine the direction of travel of an electromagnetic surface wave, which determination may be made by comparing DC voltage signals.

In one embodiment of the present invention, a surface wave directional detection system determines the direction in one dimension in which an electromagnetic wave is propagating along a metallic surface, such as a metallic plate having a top and bottom surface. The system includes a first loop probe positioned upon or in close proximity to the top surface (along which the electromagnetic wave propagates) such that a first loop plane in which the first loop probe resides is positioned normal to the top surface. Also included is a second loop probe preferably equal in size to the first loop probe and positioned upon or in close proximity to the top surface at a distance from the first loop probe approximately equal to one quarter of a wavelength of a surface wave propagating thereon such that a second loop plane in which the second loop probe resides is positioned normal to the top surface and preferably coplanar to and in line with the first loop plane so that the electromagnetic surface wave induces a signal in the first and second loop probes.

The first and second loop probes are electrically connected to a center conductor of a transmission line or the like that is disposed below the bottom surface of the metallic plate, the two connection points being separated from each other by a distance approximately equal to one quarter of the wavelength of the wave in the transmission line. The system also includes a first and a second RF detector, each coupled to an opposite end of the transmission line, and means for comparing the output signals of the RF detectors and for determining therefrom the direction the electromagnetic surface wave is propagating.

In accordance with another embodiment of the present invention, a surface wave directional detection system has a first loop probe positioned upon or in close proximity to a top surface of the metallic plate (along which the electromagnetic wave propagates), and a second loop probe, preferably equal in size to the first loop probe, positioned upon or in close proximity to the top surface at a distance from the first loop probe approximately equal to one quarter of a wavelength of an electromagnetic surface wave propagating thereon such that first and second loop planes in which the first and second loop probes respectively reside are preferably aligned and coplanar and are perpendicular to the top surface so that the electromagnetic surface wave induces a signal in the first and second loop probes.

A first transmission line or the like is electrically connected to the first loop probe at a first end of the transmission line and to a first input port of a hybrid coupler at a second end of the transmission line, and a second transmission line is electrically connected to a second loop probe at a first end of the line and to a second input port of the hybrid coupler at a second end. Also included are a first RF detector electrically coupled to a first output port of the hybrid coupler, a second RF detector electrically coupled to a second output port of the hybrid coupler, and means for comparing the output signals of the RF detectors and for determining therefrom from which direction the electromagnetic surface wave is propagating.

In one implementation of the above-described embodiment, the electrical length of the first transmission line equals the electrical length of the second transmission line plus an amount approximately equal to one quarter of the wavelength of the electromagnetic surface wave, and the hybrid coupler is a 180° hybrid. In a second implementation of the above-described embodiment, the electrical length of the first transmission line equals the electrical length of the second transmission line and the hybrid coupler is a quadrature hybrid.

In accordance with yet another embodiment of the present invention, the surface wave directional detection system determines the direction in two dimensions in which an electromagnetic surface wave within a known range of frequencies is propagating along a metallic surface. The system includes a first set of loop probes containing a first and a second loop probe, preferably equal to each other in size, positioned on or in close proximity to the metallic surface and separated by a distance approximately equal to one quarter of a wavelength of the electromagnetic surface wave propagating thereon such that a first and second loop plane in which the first and second loop probes respectively reside are preferably aligned, coplanar with each other and perpendicular to the top surface.

The system further includes a second set of loop probes containing a third and a fourth loop probe, also preferably equal to each other in size, and positioned on or in close proximity to the top metallic surface at a distance approximately equal to one quarter of a wavelength of the electromagnetic surface wave such that a third and fourth plane in which the third and fourth loop probes respectively reside are preferably aligned, coplanar with each other and perpendicular to the top surface. Also, the common plane in which the first and second loop planes reside is preferably disposed perpendicular to the common plane in which the third and fourth loop planes reside. The electromagnetic surface wave induces signals in the first, second, third and fourth loop probes.

The system further includes a first, a second, a third and a fourth transmission line or the like, electrically connected to the first, second, third and fourth loop probes, respectively, and having equal electrical lengths, a first quadrature hybrid with a first and second input port, each electrically coupled to the first and second transmission lines, respectively, and a second quadrature hybrid having a first and a second input port, each electrically coupled to the third and fourth transmission lines, respectively. The system still further includes a first and a second RF detector, respectively electrically coupled to a first and second output port of the first quadrature hybrid, a third and a fourth RF detector, respectively electrically coupled to a first and a second output port of the second quadrature hybrid, and means for comparing signal energy detected at the first, second, third and fourth RF detectors and for determining therefrom from which direction the electromagnetic surface wave is propagating.

In accordance with yet another embodiment of the present invention, a method is provided for determining the direction, such as in two dimensions as described below, in which an electromagnetic surface wave is propagating along a metallic surface. The method contains the steps of positioning a first and a second loop probe upon or in close proximity to the metallic surface such that an electromagnetic surface wave propagating thereon induces signals in the first and second loop probes that are out of phase with each other, and positioning a third and fourth loop probe upon or in close proximity to the metallic surface such that signals induced in the third and fourth loop probes are out of phase with each other. The first and second loop probes preferably reside in one plane and the third and fourth loop probes preferably reside in another plane, and the four loop probes are positioned such that their respective planes are perpendicular to each other.

The method further includes the steps of delaying a first portion of the signal induced in the second loop probe by a predetermined time and combining the delayed portion with a first portion of the signal induced in the first loop probe to form a first composite signal, and delaying a second portion of the signal induced in the first loop probe by a predetermined time and combining the delayed second portion with a second portion of the signal induced in the second loop probe to form a second composite signal, such as by using a quadrature hybrid. In a similar manner, a portion of the induced signal from the fourth loop probe is delayed and then combined with a portion of the induced signal from the third probe to form a third composite signal, and a portion of the induced signal from the third probe is delayed and then combined with a portion of the signal from the fourth loop probe to form a fourth composite signal. The method further includes the step of comparing the four composite signals and generating an output signal in response to this comparision, which output signal is indicative of the direction of propagation in two dimensions that the electromagnetic wave is travelling on the metallic surface.

These and other objects, features and advantages of this invention will become apparent from the following detailed description of the preferred embodiments which is to be read in connection with the accompanying drawings.

BRIEF DESCRIPTION OF DRAWINGS

FIG. 4B is a block diagram of the surface wave directional detection system depicted in FIG. 4A; and FIGS. 5A and 5B are graphs showing voltage signals detected at the RF detectors of the surface wave directional system depicted in FIG. 4B.

DETAILED DESCRIPTION OF THE PREFERRED EMBODIMENTS

Figure 1:
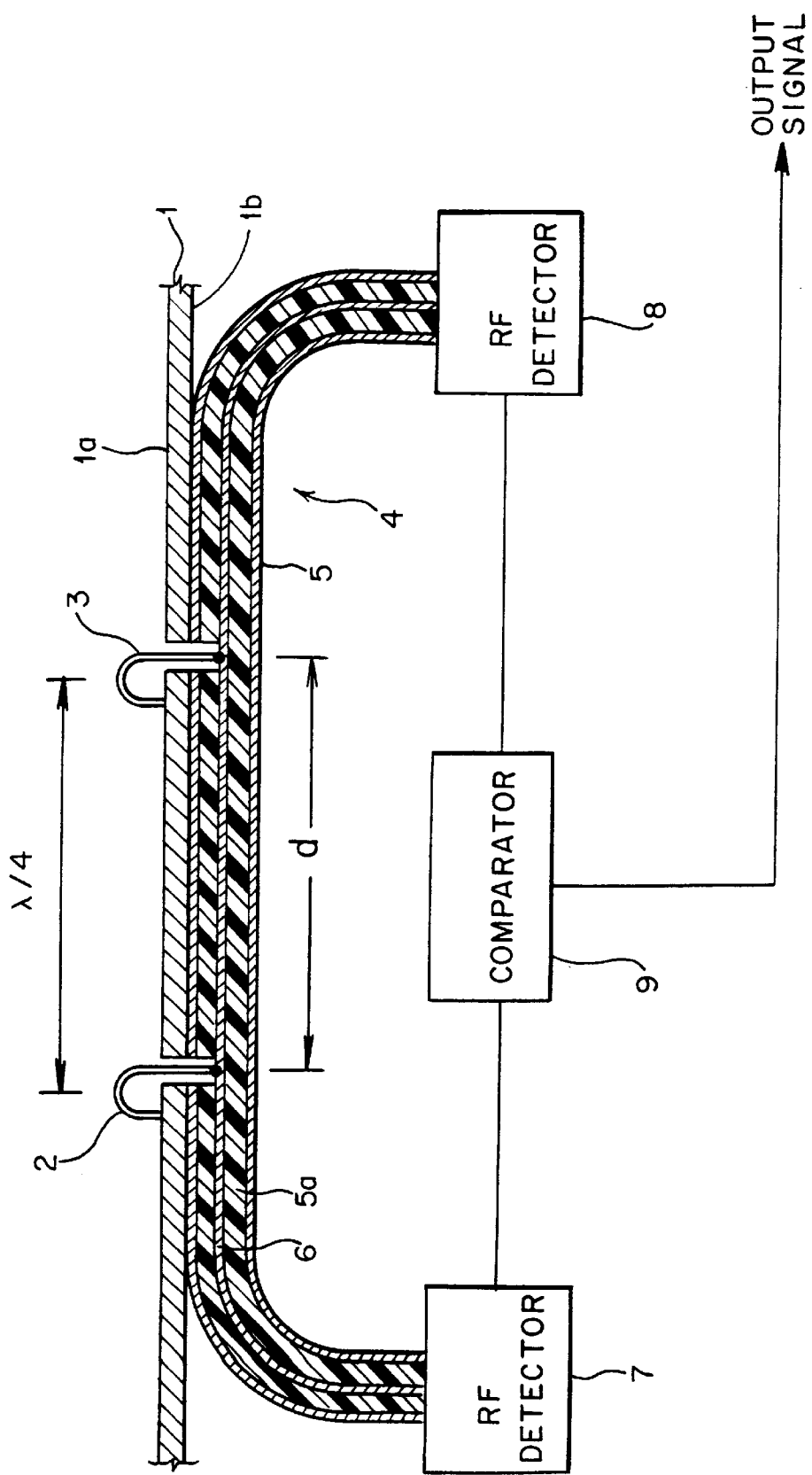
FIG. 1 is a block diagram depicting one embodiment of the surface wave directional detection system of the present invention.

FIG. 1 illustrates one embodiment of the surface wave directional detection system of the present invention. The surface wave directional detection system shown in the figure is adapted for detecting the direction of propagation in one dimension of an electromagnetic surface wave travelling along a metallic surface. For purposes of illustration, the metallic surface along which the electromagnetic wave travels is depicted in FIG. 1 as being the top metallic surface 1a of a metal plate 1, also having an opposite bottom metallic surface 1b. The system includes a first loop probe 2 and a second loop probe 3. The first and second loop probes 2 and 3 are preferably equal in size and disposed on or in close proximity to the top metallic surface 1a and are preferably spaced apart at a distance from each other equal to about one quarter of a wavelength $\lambda$ of an electromagnetic wave within a known range of frequencies propagating upon the surface. Each of the first and second loop probes 2 and 3 reside in a respective loop plane, and each loop plane preferably is aligned and coplanar with each other and each is preferably perpendicular to the plane in which the top metallic surface 1a resides.

The magnetic field of the electromagnetic surface wave induces a current signal in the first and second loop probes 2 and 3. Because the magnetic field of an electromagnetic wave is directed perpendicular to the direction of propagation, the induced current signals are at a maximum when the propagation direction follows a line which is parallel to the plane in common between the first and second loop probes 2 and 3. Further, because of the spacing between the loop probes, the energy arriving at loop probe 2, for example, from a wave travelling from the left when viewing FIG. 1, induces a signal that is out of phase with that signal induced by the energy arriving at loop probe 3. The phase difference is a function of the angle of incidence of the signal moving along the top surface 1a relative to the loop probes and the spacing between the loop probes. If the angle of incidence is 0°, i.e., the wave is travelling in a direction parallel with the common plane of the probes, and the spacing between probes is a quarter wavelength, the magnetic field is at a maximum and the phase difference is equal to 90° or ¼ wavelength of the wave propagating on the metallic surface.

The mechanical dimension of loop probes 2 and 3 should be equal so that equal magnitude signals are induced within them, i.e., the loops have the same directive gain. If the loop probes have different gains, then further gain compensation or equalization, such as by using an amplifier or the like coupled to the output of the probes, may be employed to equalize their gains. The loop probes 2 and 3 also should be short electrically in comparison to the propagating electromagnetic wave for good loop coupling of the electromagnetic energy.

The system also contains a transmission line or the like 4 (for example, a microstripline wave guide or, as shown, a coaxial cable) with a first end and a second end. The coaxial transmission line shown also includes a center conductor 6 and a ground plate or shield 5 (which may be connected to the metal plate 1) separated by a dielectric 5a. The first and second loop probes 2 and 3 are electrically connected to center conductor 6, and the electrical distance between the points where the probes are connected to the center conductor, taking into account the material of the dielectric 5a (and the width, if microstripline is used), is approximately equal to one quarter of a wavelength of the corresponding electromagnetic wave propagating in the transmission line.

A first RF detector 7 and a second RF detector 8, each having an input and an output, are also preferably included in the system of the present invention. The first RF detector 7 is electrically coupled at its input to a first end of transmission line 4 for detecting signal energy therein, and the second RF detector 8 is electrically coupled at its input to an opposite second end of transmission line 4 for detecting signal energy therein. The system also includes comparing means, which in one form may be a voltage comparator 9, electrically coupled to the outputs of the first and second RF detectors 7 and 8 for comparing the magnitude of the signals in the transmission line and provided to the RF detectors and generating an output signal in response to this comparison, which output signal is indicative of the direction the electromagnetic surface wave is propagating.

The magnetic field sampled by the loop probes induces a current signal in the probes which, in turn, induces a time varying signal on the transmission line 4. The power of the signal induced on the transmission line by loop probe 2, as well as the power of the signal induced on the line by loop probe 3, is split such that a wave or time varying signal travels in opposite direction in the transmission line 4 from the points where loop probes 2 and 3 are connected.

Because the loop probes 2 and 3 and the points where they are connected to the transmission line 4 are separated by a quarter wavelength, the signal components induced in the transmission line 4 by probes 2 and 3 will either add or subtract depending upon the direction of propagation of the surface wave.

More specifically, a surface wave travelling from left to right when viewing FIG. 1 will cause the signal components of the induced waves in the transmission line from the two loop probes travelling to the right to add since they are in phase, and thus form a first composite signal (i.e., a sum signal) at one end of the transmission line. Signal components travelling to the left in the transmission line subtract and create a null since the signal component induced in the line from the second probe 3 is delayed by half a wavelength and is out of phase relative to the signal component induced in the line from the first probe 2. Thus, the two signal components travelling to the left form a second composite signal (i.e., a difference signal) at the other end of the transmission line.

Similarly, for a surface wave propagating in a direction from right to left (when viewing FIG. 1), the induced signal components travelling to the left in the transmission line add, and those travelling to the right subtract.

As mentioned previously, the opposite ends of the transmission line 4 are preferably respectively coupled to the first and second RF detectors 7, 8, and the outputs of the RF detectors provide a voltage signal which is proportional to the magnitude of the first and second composite signals (i.e., the sum and difference signals) on the transmission line provided to the inputs of the detectors. Accordingly, the voltages measured at the respective outputs of the RF detectors provide an indication of the direction of travel of the surface wave.

The outputs of the RF detectors 7,8 are provided to the inputs of the comparator 9. The comparator compares the voltage signals on the outputs of detectors 7,8 and provides an output signal which is indicative of which voltage is greater and, accordingly, the direction of travel of the surface wave. If the output signal from RF detector 8 is greater than that of detector 7, then the surface wave is propagating from left to right (when viewing FIG. 1), that is, in a direction from the first loop probe 2 toward the second loop probe 3. If the output of detector 7 is greater than that of detector 8, then the wave is travelling from right to left, that is, from the second loop probe 3 toward the first loop probe 2.

Figure 2:
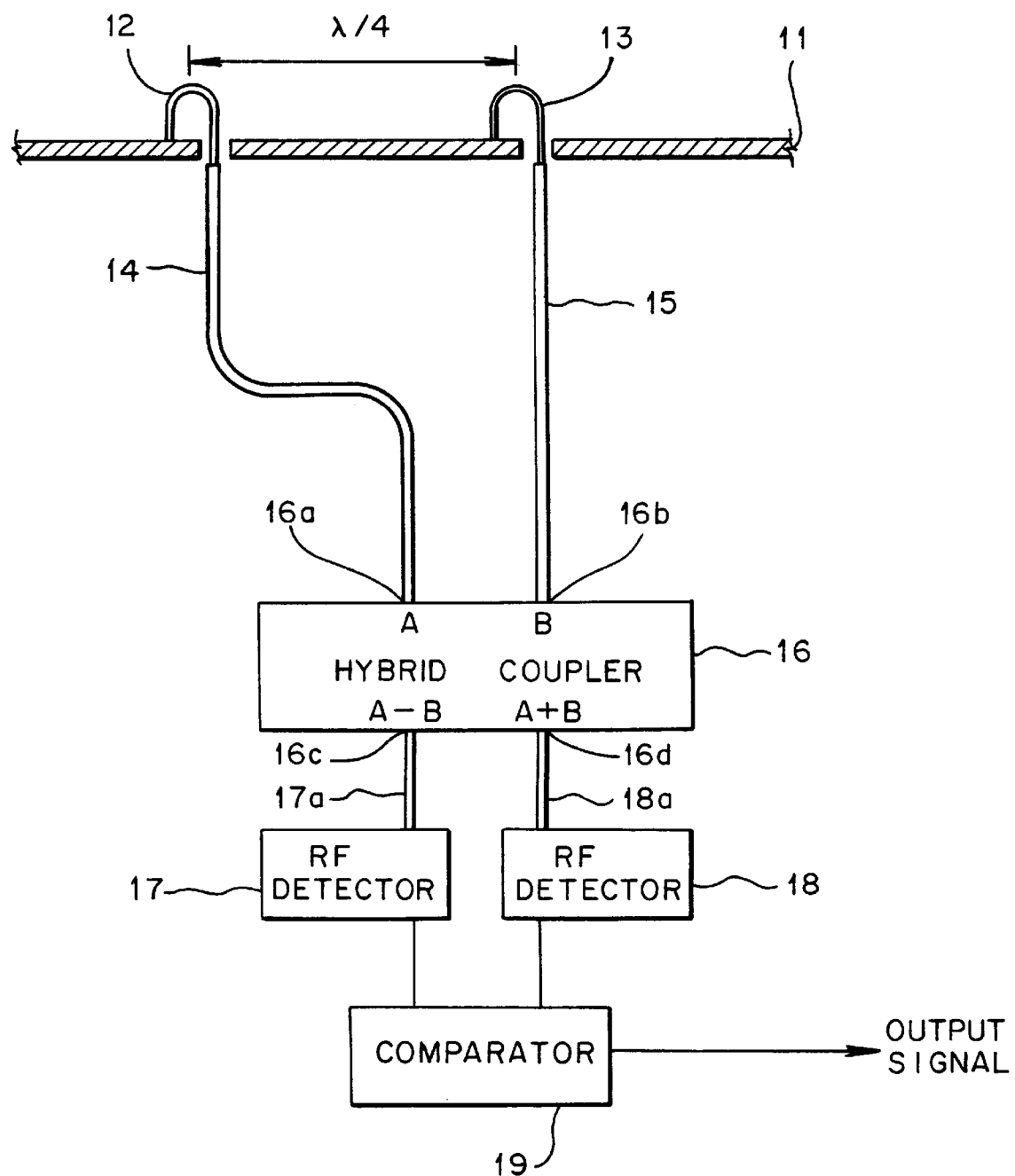
FIG. 2 is a block diagram depicting a second embodiment of the surface wave directional detection system of the present invention.

FIG. 2 illustrates a second embodiment of the surface wave directional detection system of the present invention for detecting the direction of travel of electromagnetic surface waves along a metallic surface 11. The system includes a first loop probe 12 and a second loop probe 13 which is preferably equal in size to the first loop probe 12. As with the embodiment shown in FIG. 1 and as described above, the electrical loop length should be small relative to the wavelength of an electromagnetic surface wave propagating along the metallic surface. Loop probes 12 and 13 are disposed on or in close proximity to metallic surface 11 and are spaced apart at a distance from each other approximately equal to one quarter of a wavelength of the surface wave, and the plane of each loop is preferably aligned and coplanar to each other and preferably perpendicular to the plane of the metallic surface 11.

This system further includes a transmission line 14 connected at a first end to loop probe 12 and a transmission line 15 connected at a first end to loop probe 13. A second end of transmission line 14 is connected to a first input port 16a of a 180° hybrid (or "magic tee") coupler 16 and a second end of transmission line 15 is connected to a second input port 16b of hybrid coupler 16. A first output "difference" port 16c and a second output "sum" port 16d of hybrid coupler 16 are preferably electrically coupled through transmission lines 17a and 18a to first and second RF detectors 17 and 18, respectively.

The first transmission line 14 is one quarter wavelength longer than the second transmission line 15. Accordingly, for a surface wave travelling from left to right in FIG. 2, the induced signal components of the wave from probes 12 and 13 and on transmission lines 14 and 15 will arrive at the hybrid in phase and will provide a sum voltage signal at output port 16i dand a null at output port 16c. Similarly, for a surface wave travelling from right to left when viewing FIG. 2, the signal components will arrive out of phase at the hybrid 16, thereby providing a null at output port 16d and a sum signal at output port 16c.

First and second output ports 16c and 16d of the 180° hybrid 16 are preferably connected through transmission lines 17a and 18a to the first and second RF detector 17 and 18, respectively. The outputs of RF detectors 17 and 18 are electrically coupled to a pair of inputs of comparing means, which is preferably a voltage comparator 19. Comparator 19 compares the detector output voltage signals corresponding to the RF energy detected by RF detectors 17 and 18 and generates an output signal in response to the comparison, which output signal is indicative of the direction the electromagnetic surface wave is propagating, in the same manner as described previously with respect to the embodiment illustrated by FIG. 1.

Figure 3:
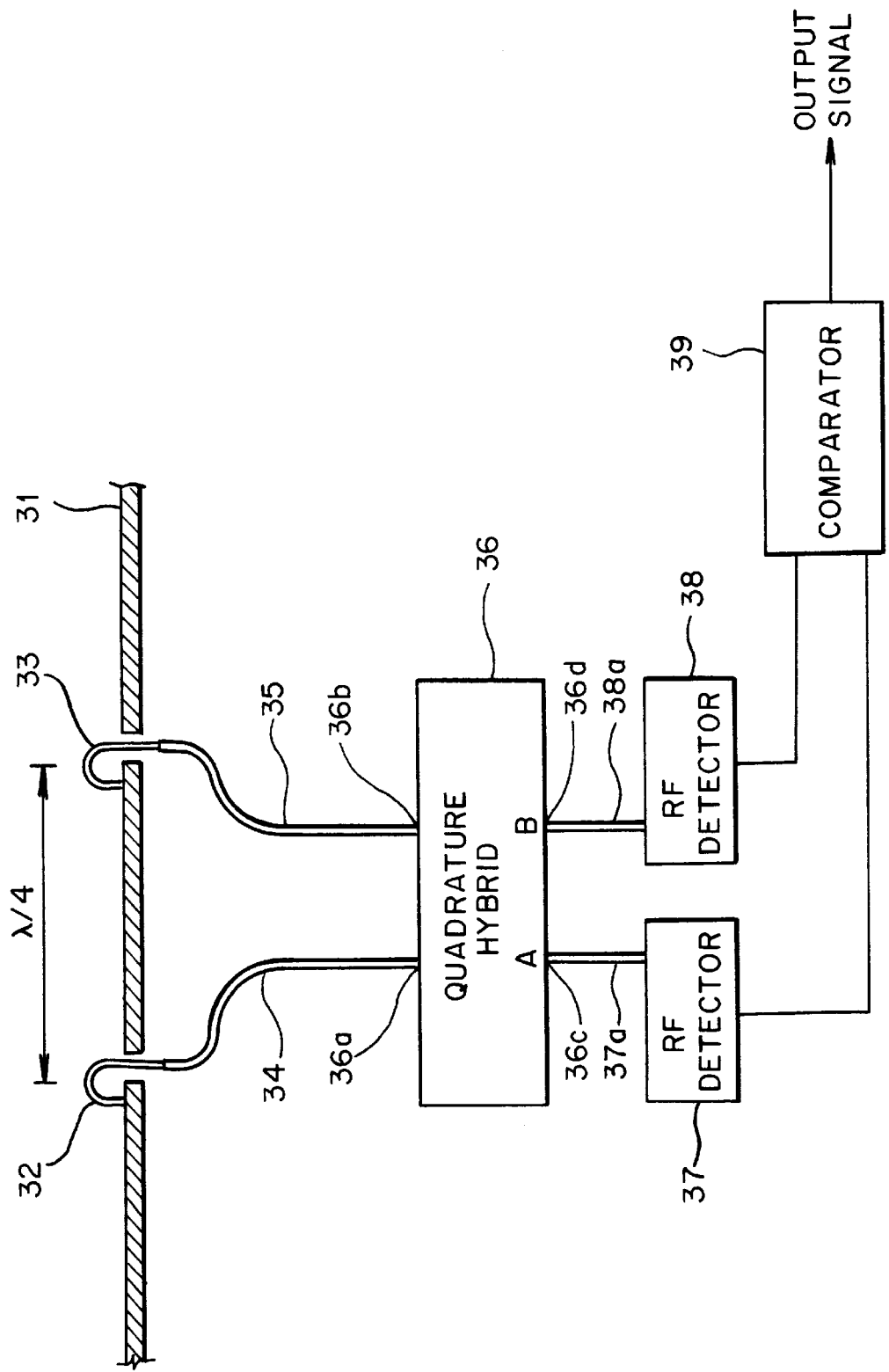
FIG. 3 is a block diagram of another form of the surface wave directional detection system of the present invention as depicted in FIG. 2.

FIG. 3 illustrates a third embodiment of the surface wave directional detection system of the present invention. The system includes a first loop probe 32 and a second loop probe 33 disposed on or in close proximity to a metallic surface 31 and separated preferably by a quarter wavelength, as described in FIGS. 1 and 2 and as discussed above. A first transmission line 34 is connected at a first end to the first loop probe 32, and a second transmission line 35, equal in electrical length to the first transmission line 34, is connected at a first end to the second loop probe 33. Second ends of first and second transmission lines 34 and 35 are respectively connected to a first and second input port 36a and 36b of a quadrature hybrid (or 3dB hybrid coupler) 36.

As in the embodiment of FIG. 2, the system preferably includes a first RF detector 37 which is coupled by transmission line 37a to "A" output port 36c of quadrature hybrid 36, and a second RF detector 38 which is coupled by transmission line 38a to "B" output port 36d of hybrid 36. The RF detectors 37, 38 detect the amount of signal energy at the hybrid output ports and provide a proportional voltage signal on their outputs. RF detectors 37 and 38 are also electrically connected to comparing means, such as voltage comparator 39, which compares the detectors' output voltage signals and determines therefrom the direction the electromagnetic surface wave is propagating.

A surface wave travelling from left to right when viewing FIG. 3 causes the induced signal component at port 36a to lead that at port 36b of the quadrature hybrid 36 by 90°. This will result in a null at the "A" output port 36c and a sum signal at the "B" output port 36d. Conversely, a surface wave travelling from right to left, when viewing FIG. 3, will cause an induced signal component at input 36b of hybrid 36 to lead the induced signal component at input 36a by 90°. This will produce a null at the "B" output port 36d and a sum signal at the "A" output port 36c. The null and sum signals on the output ports of the quadrature hybrid 36 are detected by the RF detectors 37,38, and the corresponding voltage signals from the detectors are compared by the comparator 39, which generates an output signal indicative of the direction of travel of the surface wave, as described in relation to the previous embodiments.

Figure 4A:
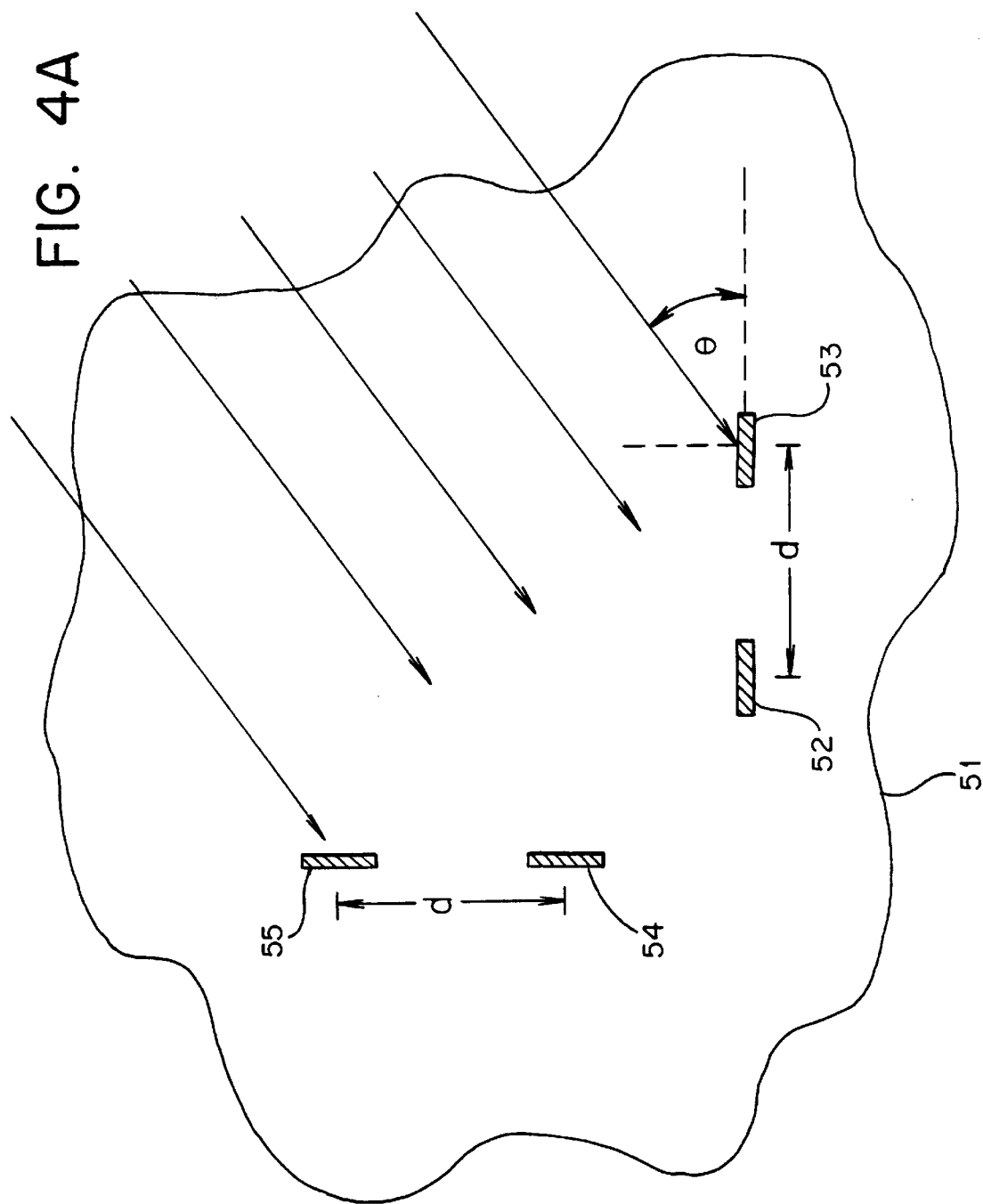
FIG. 4A is a top plan view of a metallic surface upon which is disposed two sets of loop probes of the surface wave directional detection system of the present invention.

FIGS. 4A and 4B illustrate yet another embodiment of the surface wave directional detection system of the present invention. The surface wave directional detection system shown in the figures is adapted to detect the direction of propagation in two dimensions of an electromagnetic wave propagating along a metallic surface. The system includes two pairs of probes—a first and second loop probe, 52, 53, and a third and fourth loop probe 54 and 55, each of which is disposed on or positioned in close proximity to a metallic surface 51. The four loop probes are preferably equal in size. The first and second loop probes 52, 53 are arranged at a distance d from each other, distance d being preferably equal to about one quarter of a wavelength of the surface wave within a known range of frequencies propagating upon metallic surface 51, and such that the plane in which each loop probe resides is preferably aligned, coplanar to each other and perpendicular to the plane of the metallic surface 51. Third and fourth loop probes 54 and 55 are arranged in a like manner and separated by distance d. Loop probes 54 and 55 are also preferably coplanar, and the common plane containing their respective loop planes is transverse to, and more preferably, perpendicular to the common plane in which the first and second loop probes and their respective loop planes reside.

As shown in FIG. 4b, the first and second loop probes 52, 53 are electrically coupled to input ports 60a and 60b, respectively, of a first quadrature hybrid 60, by equal length transmission lines 56 and 57, respectively. Similarly, the third and fourth loop probes 54, 55 are respectively coupled to input port 61a and 61b of a second quadrature hybrid 61 by equal length transmission lines 58 and 59, respectively. The "A" and "B" output ports, 60c and 60d respectively, of the first quadrature hybrid are preferably coupled by transmission lines 62a and 63a to the inputs of first and second RF detectors, 62 and 63, respectively, and, similarly, the "A" and "B" output ports, 61c and 61d, respectively of the second quadrature hybrid 61 are preferably connected by transmission lines 64a and 65a to third and fourth RF detectors, 64 and 65, respectively. The outputs of the RF detectors 62–65 are connected to a comparator 66 which generates an output signal on its output in response to the comparison of the output voltage signals generated by the RF detectors.

To facilitate an understanding of the above-described arrangement, assume that an electromagnetic surface wave moves along the metallic surface 51 shown in FIG. 4a such that its direction of propagation defines an angle Θ with the common plane of the first and second probes 52, 53. The wavefronts arriving at the two probes 52, 53 will be out of phase by an amount proportional to angle Θ. First consider the output signals from the first quadrature hybrid 60. For simplicity, the signals provided to the inputs of the hybrids 60 and 61 are assumed to be equal in magnitude and have unit amplitude.

The induced signal from probe 52 received at first input port 60a is split in the first quadrature hybrid 60 and distributed to output port 60c in phase and to output port 60d phase shifted 90°. The induced signal from probe 53 received at second input port 60b is split in hybrid 60 and distributed in phase to output port 60d and to output port 60c 90° phase shifted. The signal components combine in the quadrature hybrid 60 and form composite signals at the output ports.

Because of the spacing d between the loop probes within the first and second sets of loop probes and the angle of incidence of the travelling wave, it can be shown through simple trigonometry that the phase difference between the signals arriving at output port 60c of quadrature hybrid 60 becomes:

$$\phi_1 = \pi/2 - [2\pi(d/\lambda)\cos\theta]$$

and the phase difference at output port 60d of quadrature hybrid 60 is:

$$\phi_2 = -\pi/2 - [2\pi(d/\lambda)\cos\theta]$$

In a like manner, the induced signals from probes 54 and 55 received at the input ports 61a and 61b of quadrature hybrid 61 are split and phase shifted 90°. The phase difference between the signals arriving at output port 61c becomes:

$$\phi_3 = \pi/2 - [2\pi(d/\lambda)\cos(\pi/2+\theta)]$$

and the phase difference at output port 61d of quadrature hybrid 61 is:

$$\phi_4 = -\pi/2 - [2\pi(d/\lambda)\cos(\pi/2+\theta)]$$

The amplitude of the output signal from output port 60c of hybrid 60 may be described mathematically as:

$$V_1 = |\sqrt{2}\cos(\phi_1/2)\cos\theta|$$

Amplitude $V_1$ is clearly a maximum when the surface wave is travelling in a direction coplanar to a plane containing the planes of loop probes 52 and 53, i.e., angle $\theta=0$. Similarly, the amplitude of the output from hybrid output port 60d may be described mathematically, as:

$$V_2 = |\sqrt{2}\cos(\phi_2/2)\cos\theta|$$

In the same manner, the amplitude of the output signals from output port 61c of hybrid 61 may be expressed as:

$$V_3 = |\sqrt{2}\cos(\phi_3/2)\sin\theta|$$

and from hybrid output port 61d as:

$$V_4 = |\sqrt{2}\cos(\phi_4/2)\sin\theta|$$

The outputs of RF detectors 62–65 are electrically connected to comparator 66. Comparator 66 compares the four output voltage signals from the detectors, which are proportional to the amplitude of their corresponding output signals from hybrids 60, 61, and, based upon this comparison, generates an output signal indicative of the direction the wave is propagating along surface 51.

FIGS. 5a and 5b are graphs plotting the amplitude of output signals $V_1$ through $V_4$ against angle $\Theta$, the direction of travel of the surface wave, for distance d equal to a quarter wavelength. It is clear from FIGS. 5a and 5b that the relative amplitudes of the output signals may be used not only to determine the quadrant of arrival of the surface wave but also the particular angle of arrival or direction of propagation. For example, in quadrant I shown in FIGS. 5a and 5b, the amplitudes of output signals $V_1$ and $V_3$ are greater than those of signals $V_2$ and $V_4$. Also, in the same quadrant I, the amplitudes of output signals $V_2$ and $V_4$ are substantially equal. In quadrant II, the amplitudes of output signals $V_3$ and $V_2$ are greater than those of signals $V_1$ and $V_4$, and the amplitudes of output signals $V_1$ and $V_4$ are substantially equal. Similar but unique relationships exist in the other two quadrants for the four output signals $V_1$–$V_4$. Accordingly, by comparing the amplitudes of the four output signals from hybrids 60 and 61 (or for that matter the proportional output voltage signals from the RF detectors 62–65), the direction of travel of the surface wave in two dimensions may be determined. Comparator 66 will make this comparison and provide an output signal indicative of the direction of propagation of the surface wave.

One method of determining the angle $\Theta$ within a particular quadrant is to determine a ratio of the two largest of all four voltages. For example, in quadrant I, the ratio of the amplitudes of signals $V_3$ to $V_1$ may be used to determine the angle. Optionally, the inverse of that ratio, or the ratio of the amplitude of signal $V_1$ to signal $V_3$, may be used when the amplitude of signal $V_1$ is less than the amplitude of signal $V_3$ in order to prevent the ratio from being a large value. In this manner, all ratios will range between 0 and 1.

It should be noted that since voltage comparisons and ratios are used for determining the angle, the measurement is independent of signal strength. If the RF detectors 62–65 are used at the four output ports of hybrids 60, 61, then only DC measurements are needed to determine the angle of travel of the surface wave.

As is evident from the descriptions of the surface wave directional detection systems illustrated by FIGS. 1–5, a method for determining the direction an electromagnetic wave is propagating along a metallic surface, in accordance with the present invention, includes the steps of positioning at least a first loop probe in close proximity to the metallic surface such that an electromagnetic wave propagating on the surface induces a signal in the first loop probe, and positioning at least a second loop probe also in close proximity to the metallic surface such that a signal is induced in the second loop probe. The first and second loop probes are positioned such that they are spaced apart from each other a predetermined distance, such as a quarter wavelength, so that the signal induced in the second loop probe is out of phase with the signal induced in the first loop probe.

The method further includes the steps of combining at least portions of the induced signals of the first and second loop probes to generate at least a first composite signal and a second composite signal. Preferably, a first portion of the signal induced in the second loop probe is delayed by a predetermined time, such as a quarter wavelength, and combined with a first portion of the signal induced in the first loop probe to form the first composite signal. Similarly, preferably a second portion of the signal induced in the first loop probe is delayed by a predetermined time, such as a quarter wavelength, and combined with a second portion of the signal induced in the second loop probe to form the second composite signal, such as by using a quadrature hybrid. The magnitude of the first composite signal is greater than the magnitude of the second composite signal when the electromagnetic wave is travelling in one direction, and the magnitude of the second composite signal is greater than the magnitude of the first composite signal when the wave is travelling in a different direction.

The method further includes the step of comparing the magnitudes of the first composite signal and the second composite signal and generating an output signal in response to their comparison. The output signal which is generated is indicative of the direction of travel of the electromagnetic wave.

For determining the direction in two dimensions in which an electromagnetic surface wave is propagating along a metallic surface, the method further includes the steps of positioning third and fourth loop probes in close proximity to the metallic surface and spacing the probes apart from each other a predetermined distance such that signals induced in the third and fourth probes are out of phase with one another, and combining at least portions of the induced signals of the third and fourth loop probes to generate a third and fourth composite signal. In a similar manner to the induced signals from the first and second loop probes, a portion of the induced signal from the fourth loop probe is delayed and then combined with a portion of the induced signal from the third probe to form the third composite signal, and a portion of the induced signal from the third probe is delayed and then combined with a portion of the signal from the fourth loop probe to form the fourth composite signal. The magnitudes of the third and fourth composite signals will vary in accordance with the direction of travel of the electromagnetic surface wave. The magnitudes of the four composite signals are compared, and an output signal is generated in response to this comparison, which output signal is indicative of the direction of travel of the electromagnetic wave.

As described previously, the present invention provides a system and method for determining the direction in one or two dimensions of travel of an electromagnetic surface wave. With the present invention, no RF measurements need be involved. Only amplitude comparisons and ratios are used for determining the angle of travel. As a result, measurements are independent of signal strength.

Although illustrative embodiments of the present invention have been described herein with reference to the accompanying drawings, it is to be understood that the invention is not limited to those precise embodiments, and that various other changes and modifications may be effected therein by one skilled in the art without departing from the scope or spirit of the invention.

What is claimed is:

1. A surface wave directional detection system for determining the direction in which an electromagnetic wave propagating along a metallic surface is travelling, comprising:

at least a first loop probe disposed in close proximity to the metallic surface;

at least a second loop probe disposed in close proximity to the metallic surface and spaced apart from the first loop probe a first predetermined distance, wherein an electromagnetic wave travelling along the metallic surface induces a signal in the first and second loop probes;

a transmission line having a first probe connection point and a second probe connection point, the first and second loop probes being electrically coupled to the transmission line at the first probe connection point and the second probe connection point, respectively, the first probe connection point and the second probe connection point being separated by a second predetermined distance;

at least a portion of the signal induced in the first loop probe being transmitted on the transmission line from the first probe connection point to the second probe connection point, and at least a portion of the signal induced in the second loop probe being transmitted on the transmission line from the second probe connection point to the first probe connection point, the induced signal portions of the first and second loop probes combining to form a first composite signal at the first probe connection point and a second composite signal at the second probe connection point; and means for comparing the first composite signal and the second composite signal, the comparing means being responsive to the first and second composite signals and generating an output signal in response to the comparison thereof, the output signal being indicative of the direction of travel of the electromagnetic wave.

2. A surface wave directional detection system as defined by claim 1, wherein each of the first and second predetermined distances is substantially equal to a quarter wavelength of an electromagnetic wave propagating along the metallic surface and in the transmission line, respectively.

3. A surface wave directional detection system as defined by claim 1, which further comprises at least first and second RF detectors, the first and second RF detectors being interposed between and electrically coupled to the transmission line and the comparing means.

4. A surface wave directional detection system as defined by claim 1, wherein the first loop probe resides in a first loop plane, the first loop probe being positioned with respect to the metallic surface such that the first loop plane is normal to the metallic surface; and wherein the second loop probe resides in a second loop plane, the second loop probe being positioned with respect to the metallic surface such that the second loop plane is normal to the metallic surface.

5. A surface wave directional detection system as defined by claim 4, wherein the first and second loop probes are positioned such that the first loop plane is coplanar to the second loop plane.

6. A surface wave directional detection system for determining the direction in which an electromagnetic wave propagating along a metallic surface is travelling, which comprises:

at least first and second loop probes disposed in close proximity to the metallic surface, the first loop probe and second loop probe being spaced apart a quarter wavelength of an electromagnetic surface wave propagating on the metallic surface such that the electromagnetic wave induces a signal in the first and second loop probes;

a transmission line having a first end and a second end and having a first probe connection point and a second probe connection point, the first and second loop probes being electrically coupled to the transmission line at the first probe connection point and the second probe connection point, respectively, the first probe connection point and the second probe connection point being separated by a quarter wavelength of the corresponding electromagnetic wave propagating in the transmission line;

a first RF detector electrically coupled to the first end of the transmission line, and a second RF detector electrically coupled to the second end of the transmission line, each of the first and second RF detectors having an output and generating thereon an output signal in response to an electromagnetic wave propagating along the metallic surface; and a comparator, the comparator being electrically coupled to the outputs of the first and second RF detectors and generating an output signal in response to the output signals of the RF detectors, the output signal of the comparator being indicative of the direction of travel of the electromagnetic wave.

7. A surface wave directional detection system for determining the direction in which an electromagnetic wave propagating along a metallic surface is travelling, which comprises:

at least a first loop probe disposed in close proximity to the metallic surface;

at least a second loop probe disposed in close proximity to the metallic surface and spaced apart from the first loop probe a first predetermined distance, wherein an electromagnetic wave travelling along the metallic surface induces a signal in the first and second loop probes;

a first transmission line having first and second ends, the first transmission line being electrically coupled at the first end thereof to the first loop probe;

a second transmission line having first and second ends, the second transmission line being electrically coupled at the first end thereof to the second loop probe;

at least one hybrid coupler having a first input port, a second input port, a first output port and a second output port, the first input port being electrically coupled to the second end of the first transmission line and the second input port being electrically coupled to the second end of the second transmission line, the hybrid coupler generating an output signal on each of the first and second output ports in response to an electromagnetic wave propagating along the metallic surface; and means for comparing the output signals generated by the hybrid coupler, the comparing means being responsive to the output signals of the hybrid coupler and generating an output signal in response to the comparison thereof, the output signal of the comparing means being indicative of the direction of travel of the electromagnetic wave.

8. A surface wave directional detection system as defined by claim 7, wherein the length of the first transmission line from the first end to the second end thereof is greater than the length of the second transmission line from the first end to the second end thereof by an amount substantially equal to one quarter of the wavelength of the electromagnetic wave;

wherein the first predetermined distance is substantially equal to one quarter of the wavelength of the electromagnetic surface wave; and wherein the hybrid coupler is a 180° hybrid.

9. A surface wave directional detection system as defined by claim 7, wherein the length of the first transmission line from the first end to the second end thereof substantially equals the length of the second transmission line from the first end to the second end thereof;

wherein the first predetermined distance is substantially equal to one quarter of the wavelength of the electromagnetic surface wave; and wherein the hybrid coupler is a quadrature hybrid.

10. A surface wave directional detection system as defined by claim 7, which further comprises at least first and second RF detectors, the first RF detector being electrically coupled to the first output port of the hybrid coupler, and the second RF detector being electrically coupled to the second output port of the hybrid coupler, each of the first and second RF detectors having an output; and wherein the comparing means is electrically coupled to the outputs of the first and second RF detectors.

11. A surface wave directional detection system as defined by claim 7, wherein the first loop probe resides in a first loop plane, the first loop probe being positioned with respect to the metallic surface such that the first loop plane is normal to the metallic surface;

wherein the second loop probe resides in a second loop plane, the second loop probe being positioned with respect to the metallic surface such that the second loop plane is normal to the metallic surface; and wherein the first and second loop probes are positioned such that the first loop plane is coplanar to the second loop plane.

12. A surface wave directional detection system for determining the direction in two dimensions in which an electromagnetic wave propagating along a metallic surface is travelling, which comprises:

a first set of at least first and second loop probes positioned in close proximity to the metallic surface and residing in a common plane;

at least a second set of at least third and fourth loop probes disposed in close proximity to the metallic surface and residing in a common plane, the first loop probe and the second loop probe being spaced apart by a predetermined distance, and the third loop probe and the fourth loop probe being spaced apart by the predetermined distance, the first and second loop probes being disposed relative to the third and fourth loop probes such that the common plane of the first and second loop probes is transverse to the common plane of the third and fourth loop probes, wherein an electromagnetic surface wave propagating along the metallic surface induces a signal in the first, second, third and fourth loop probes;

at least a first quadrature hybrid having a first input port and a second input port and a first output port and a second output port, the first input port and the second input port of the first quadrature hybrid being electrically coupled respectively to the first loop probe and the second loop probe;

at least a second quadrature hybrid having a first input port and a second input port and a first output port and a second output port, the first input port and the second input port of the second quadrature hybrid being electrically coupled respectively to the third loop probe and the fourth loop probe, the first and second quadrature hybrids generating output signals on the output ports thereof in response to an electromagnetic wave propagating along the metallic surface; and means responsive to the output signals of the first and second quadrature hybrids for comparing the output signals thereof and generating an output signal in response to the comparison thereof, the output signal of the comparing means being indicative of the direction of travel of the electromagnetic wave.

13. A surface wave directional detection system as defined by claim 12, which further comprises at least a first RF detector, a second RF detector, a third RF detector and a fourth RF detector, the first and second RF detectors being respectively electrically coupled to the first and second output ports of the first quadrature hybrid, and the third and fourth RF detectors being respectively electrically coupled to the first and second output ports of the second quadrature hybrid, each of the RF detectors having an output, the comparing means being electrically coupled to the outputs of the first, second, third and fourth RF detectors.

14. A method for determining the direction and electromagnetic wave is propagating along a metallic surface, comprising the steps of:

positioning at least a first loop probe in close proximity to the metallic surface such that an electromagnetic wave propagating thereon induces a signal in the first loop probe;

positioning at least a second loop probe in close proximity to the metallic surface such that an electromagnetic wave propagating thereon induces a signal in the second loop probe, the second loop probe being spaced apart from the first loop probe a predetermined distance such that the signal induced in the second loop probe is out of phase with the signal induced in the first loop probe;

combining at least portions of the induced signals of the first and second loop probes to generate at least a first composite signal and a second composite signal, the magnitude of the first composite signal being greater than the magnitude of the second composite signal when the electromagnetic wave is travelling in a first direction, and the magnitude of the second composite signal being greater than the magnitude of the first composite signal when the electromagnetic wave is travelling in a second direction which is different from the first direction; and comparing the magnitudes of the first composite signal and the second composite signal and generating an output signal in response to the comparison thereof, the output signal being indicative of the direction of travel of the electromagnetic wave.

15. A method as defined by claim 14, wherein the second loop probe is spaced apart from the first loop probe by a quarter wavelength of the electromagnetic wave propagating on the metallic surface.

* * * * *